United States Patent [19]

Bailey

[11] Patent Number: 5,168,328
[45] Date of Patent: Dec. 1, 1992

[54] HETEROJUNCTION IMPATT DIODE
[75] Inventor: Michael J. Bailey, Santa Clara, Calif.
[73] Assignee: Litton Systems, Inc., Beverly Hills, Calif.
[21] Appl. No.: 548,164
[22] Filed: Jul. 3, 1990
[51] Int. Cl.[5] .................. H01L 29/205; H01L 29/90
[52] U.S. Cl. .................................................. 257/199
[58] Field of Search ............................... 357/13, 16

[56] References Cited

U.S. PATENT DOCUMENTS

| | | | |
|---|---|---|---|
| 3,466,512 | 9/1969 | Seidel | 357/16 |
| 4,176,366 | 11/1979 | Delagebeaudeuf | 357/16 |
| 4,291,320 | 9/1981 | Wen et al. | 357/16 |
| 4,857,972 | 8/1989 | Jorke et al. | 357/16 |

OTHER PUBLICATIONS

High Efficiency GaInAs/InP Heterojunction IMPATT Diodes; DeJaeger et al. IEEE Transactions on Electron Decives, vol. ED-30, No. 7, Jul. 1983.
Transit-Time-Induced Microwave Negative Resistance in Ga1-xAlxAs-GaAs Heterostructure Diodes; Electonics Letters Sep. 18, 1975; vol. 11 No. 19, pp. 457-458.

*Primary Examiner*—Gene M. Munson
*Attorney, Agent, or Firm*—Poms, Smith, Lande & Rose

[57] ABSTRACT

A GaAs/AlGaAs heterojunction IMPATT diode is described. The AlGaAs n-type avalanche layer is graded so that a 0.30 eV bandgap discontinuity of the pn heterojunction is provided without any bandgap discontinuity at the avalanche/drift layer interface. Minority carriers in the p-type GaAs layer are concentrated at the junction due to the discontinuity which occurs primarily in the conduction band thereby concentrating the zero bias electric field and thus minimizing the voltage drop across the avalanche layer. Furthermore, the zero bias depletion width is increased due to the increased field, which lowers the device capacitance.

23 Claims, 2 Drawing Sheets

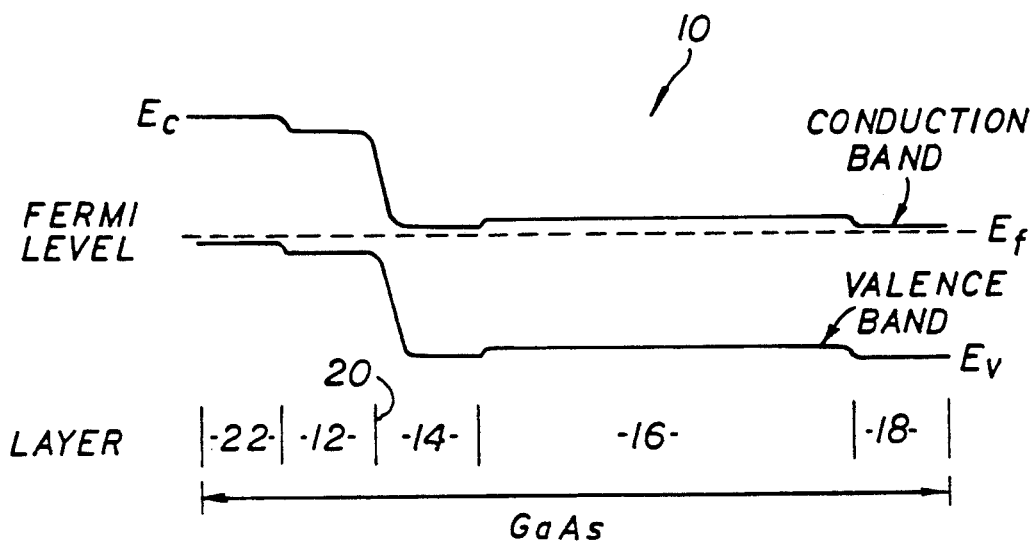
FIG. 3 (PRIOR ART)
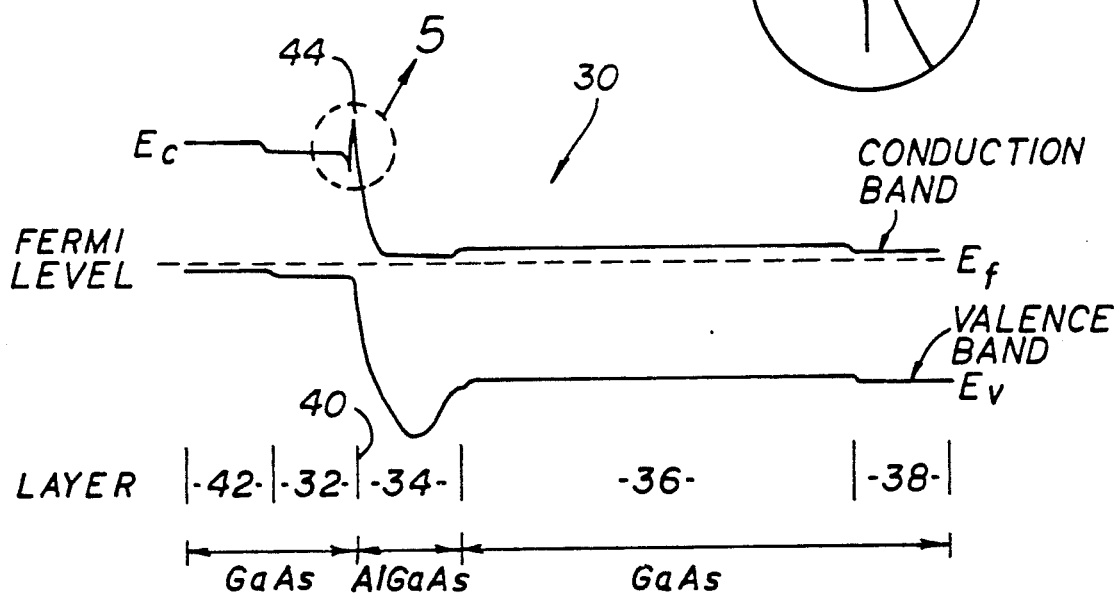
FIG. 5
FIG. 4

HETEROJUNCTION IMPATT DIODE

FIELD OF INVENTION

The present invention relates generally to two terminal semiconductor devices and more particularly a novel IMPATT diode having a heterojunction at the avalanche layer.

BACKGROUND OF THE INVENTION

An impact ionization and transit time (IMPATT) diode is a two terminal semiconductor negative conductance microwave device which operates by a combination of avalanche multiplication and transit time effects. Generally, an IMPATT diode has a simple pn junction structure which is reverse biased to avalanche breakdown. An AC voltage is then superimposed on the DC bias. The carriers generated by the avalanche process are swept through the drift region of the IMPATT diode to the terminals of the device. The AC component of the resulting current can be approximately 180° ($\pi$ radians) out of phase with the applied voltage under proper conditions of bias and device configuration, thereby giving rise to negative conductance and oscillation in a resonant circuit. IMPATT devices can convert DC to microwave AC signals with high efficiency and are very useful in the generation of microwave power for many applications.

The classical device configuration for the IMPATT diode has been originally set forth by W. T. Read. Although IMPATT operation can be obtained in simpler structures, the Read diode is an exemplary device for illustration of the basic principles.

With particular reference to FIG. 1 (prior art), a Read diode 10 includes a first device layer 12, an avalanche layer 14, a drift layer 16 and a first contact layer 18. The first device layer 12 is formed from p-type Gallium Arsenide (GaAs) and the avalanche layer 14 is formed from n-type GaAs. The first layer 12 and the avalanche layer 14 thus form a pn junction 20. The drift layer 16 is n-type GaAs (although essentially intrinsic GaAs may also be used) and the contact layer 18 is highly doped n-type GaAs. Additionally, a second contact layer of highly doped p-type GaAs may be provided adjacent the first layer 12.

Although the Read diode 10 is exemplarily described as being fabricated from GaAs, any suitable semiconductor material may be used. It is to be noted that each layer of the prior art Read diode 10 is fabricated from the same semiconductor material. It is also within the ordinary skill of the art to construct the Read diode 10 in a n-p-i-p configuration in which holes resulting from avalanche multiplication drift through the drift layer 16. For either polarity configuration of the Read diode 10, under reverse bias of the pn junction 20, avalanche multiplication occurs in the avalanche region from minority carriers thermally generated in the first device layer 12, as well known in the art. The avalanche generated majority carriers in the avalanche region 14 then drift through the drift layer 16 towards the first contact layer 18.

Although detailed calculations of the operation of the Read diode 10 are complicated and generally require computer solutions, the basic physical mechanism is simple. Essentially, the Read diode 10 operates in a negative conductance mode when the AC component of current is negative over a portion of the cycle during which the AC voltage is positive, and vice versa. The negative conductance occurs because of two processes, causing the current to lag behind the voltage in time:

(1) A delay due to the avalanche process; and
(2) a further delay due to the transit time of the carriers across the drift layer 16.

If the sum of these delay times is approximately one half cycle of the operating frequency, negative conductance occurs and the Read diode 10 can be used as an oscillator, a locked oscillator, or as an amplifier.

More particularly, the AC conductance is negative if the AC component of carrier flow drifts opposite to the influence of the AC electric field. For example, with the DC reverse bias at the pn junction 20 by appropriate application of a voltage to the first contact layer 18 and second contact layer 22, electrons drift from the avalanche layer 14 towards first contact layer 18 through the drift layer 16, under the influence of the resulting DC electric field through the drift layer 16 as expected. If an AC voltage is superimposed such that the magnitude of the electric field decreases during the positive half cycle of the superimposed AC voltage (decreasing the magnitude of the reverse bias), the drift of electrons through the drift layer 16 does not exhibit a corresponding decrease. Instead, in IMPATT operation the drift of electrons through the drift layer 16 actually increases while the magnitude of the AC field is decreasing.

In describing this aspect of the IMPATT operation, it may be assumed that the avalanche layer 14 is very narrow and that all avalanche multiplication takes place in a thin region near the pn junction 20. As is known in the art, the integral of the field times the ionization coefficient must be at least unity for the avalanche process to begin. If the DC reverse bias is such that a critical electric field $E_a$ for avalanche conditions is just met in the pn space charge region, avalanche multiplication begins (at t=0). Holes generated in the avalanche layer 14 move to the p-type first device layer 12 and second contact layer 22 and electrons enter the drift layer 16. The Read diode 10 is then mounted in a resonant microwave circuit so that an AC signal $v(t) = -v\sin(\omega t)$ can be maintained at a given frequency. As the applied AC voltage goes negative (enhancing the magnitude of the reverse bias) at $\omega t = 0^+$, more and more electrons are generated in the avalanche region. In fact, the pulse of electrons generated by the multiplication process continues to grow as long as the electric field has an absolute value of intensity greater than $E_a$. It can be shown that the partial current due to avalanche increases exponentially with time while the magnitude of the field is above the critical value. The important result of this growth is that the electron pulse reaches its peak value not at $\omega t = \pi/2$ when the AC voltage is most negative but at $\omega t = \pi$. Therefore, there is a phase delay of $\pi/2$ inherent in the avalanche process itself. The further delay is provided by the drift layer 16. Once the avalanche multiplication stops ($\pi \leq \omega t < 2\pi$), the pulse of electrons simply drifts towards the n-type first contact 18. But during this period, the AC voltage is positive. Therefore, the dynamic conductance is negative, and energy is supplied to the AC field.

If the length of the drift layer 16 is chosen properly, the pulse of electrons is collected at the n-type first contact layer 18 just as the voltage cycle is completed ($t = 2\pi$), and the cycle then repeats itself. The electron pulse will drift through the length L of the drift layer 16 during the positive half cycle of the AC voltage ($\pi \leq \omega t < 2\pi$) if the transit time $T_t$ is chosen to be one half of the oscillation period; or $$T_t = L/v_d = \tfrac{1}{2}f \text{ or } f = v_d/2L = \tfrac{1}{2}T_t$$

where f is the operating frequency and $v_d$ is the drift velocity for electrons. Therefore, in the Read diode 10, the optimum frequency is one half of the inverse transit time of electrons across the drift region $v_d/L$. In choosing an appropriate resonant circuit for the IMPATT diode 10, the parameter L is critical. To maximize efficiency and minimize harmonic generation, it is desirable that the pulse remains localized during its transit. GaAs and Indium-Phosphide (InP) possess diffusion coefficient versus electric field properties that maintain this pulse localization.

For example, taking $v_d = 10^7$ cm/sec for Silicon, the optimum operating frequency for a device with a drift layer length of five microns is $f = 10^7/2(5 \times 10^{-4}) = 10^{10}$ Hz, or 10 GHz. Negative resistance is exhibited by the diode 10 for frequencies somewhat above and below this optimum frequency for an exact 180° phase delay. Careful analysis of the small single impedance model shows that the minimum frequency for negative conductance varies as the square root of the DC bias current for frequencies in the neighborhood of that described above. It is to be understood that the above description of the operation of the prior art Read diode 10 is an ideal first order analysis.

In general, the prime performance criteria for IMPATT diodes is the conversion efficiency which is usually a percentage of the fraction of the direct input power into the diode that is converted to usable microwave energy. Since a typical IMPATT diode is physically small, typically 5-20 thousandths of an inch in diameter, the amount of input power is limited by the generation of excessive thermal energy. As the IMPATT diode becomes more efficient in the conversion of input power to usable microwave energy, the more microwave energy is available for a given input specified power.

Theoretical models of IMPATT diodes indicate that efficiency is primarily a function of two considerations. The first consideration is that the voltage drop across the avalanche layer must be held to a minimum compared to the voltage drop across the drift layer. This can be achieved by using a very narrow avalanche layer, or by reducing the electric field through the avalanche layer. The field must, however, still be maintained at or above the minimum field strength $E_a$ required to sustain impact ionization. There are also circuit related factors which bear upon the electric field strength. For example, as the frequency of operation is increased, the capacitance of the IMPATT diode must be reduced. This capacitance is a function of the diode's breakdown voltage, depletion layer capacitance and doping levels.

The second consideration is that the high efficiency IMPATT diode operates in a "premature collection mode." A full discussion of the premature collection mode is outside the scope of the present disclosure. Numerous references on IMPATT diodes which quantitatively analyze this mode may be consulted. Qualitatively, the premature collection mode results from time varying change of the effective length of the drift layer. The effective length of the drift region is defined by the extend of it which is depleted of majority carriers, the "depletion zone.[ It is in this depletion zone that the remaining electric field causes the generated carriers to drift at their maximum saturation velocities. This effective length changes as the depleted region varies in length in response to the AC voltage. For large signal AC voltages, the depletion region extends substantially through the drift layer for one-half cycle. The premature collection modes requires a relatively low doped drift layer as compared to the avalanche layer. Again, this requirement places limits on the allowable doping levels. These constraints place effective limits on the maximum conversion efficiency. For the single drift Read-type profile, such as the Read diode 10 described hereinabove, typical values that have been achieved in commercially available devices are 22-24% for X-band devices (8-12 GHz), and 19-21% for K-band devices (18-22 Ghz).

SUMMARY OF THE INVENTION

According to the present invention, a heterojunction IMPATT diode includes a first device layer of a first semiconductor material and a second device layer of a second semiconductor material. The first semiconductor material is of the first conductivity type and has a conduction band and a valence band which form a first bandgap energy. Similarly, the second semiconductor material is of a second conductivity type opposite the first type and has a conduction band and a valence band which form a second bandgap energy greater than the first bandgap energy. The first layer and the second layer are adjacently disposed to form a pn heterojunction therebetween. The first material and the second material are selected so that a difference between the first bandgap energy and the second bandgap energy causes a discontinuity substantially in a selected one of the conduction band or the valence band at the junction, wherein the selected one of the conduction band or the valence band contains majority carriers in the second region. The heterojunction IMPATT diode further includes a third device layer of a third semiconductor material adjacent the second layer so that the second layer is interposed the first layer and the third layer and a fourth device layer in adjacent the other side of the third layer. The fourth layer has the same conductivity as the second layer. The third layer may be substantially intrinsic or slightly doped to be of the same conductivity of the second and fourth layers.

An advantage of the heterojunction in the device constructed according to the principles of the present invention over the prior art discussed above is that the discontinuity concentrates the "ionizing" electric field at the pn junction in the second device layer which then minimizes the voltage drop across the second layer, which is the avalanche layer. Under reverse bias, the discontinuity allows the field in the avalanche layer then to be maintained at a necessary ionizing field strength while maintaining the voltage drop across the avalanche layer at a minimum. For example, the peak electric field may be twice the field than in a standard pn junction. In addition, the field is confined to a narrow region and then drops in magnitude quickly away from the heterojunction. Therefore, the minimum necessary ionization field can be obtained with a lower applied external voltage. A further advantage over the prior art is that the device of the present invention will supply the same AC output power with lower DC input power and is therefore more efficient. For example, the corresponding improvement in conversion efficiency for a 20 Ghz device may be from the typical 19-21 percent for a standard prior art IMPATT diode to 22-26 percent for a device constructed according to the principles of the present invention.

Another advantage of the present invention over the prior art is that the larger zero bias junction electric field causes a larger depletion region in the avalanche and drift regions. The larger depletion layer lowers the device capacitance allowing higher frequency operation. For a given frequency, the heterojunction IMPATT diode of the present invention will need to be physically larger than the prior art IMPATT diode. This is further advantageous in that the device will have a lower thermal resistivity and will operate at a lower temperature for the same dissipated power.

These and other objects, advantages and features of the present invention will become apparent from a study of the following description of the exemplary preferred embodiment when read in conjunction with the attached drawings and appended claims.

BRIEF DESCRIPTION OF THE DRAWING

FIG. 3 is an energy band diagram for the prior art diode shown in FIG. 1;

FIG. 4 is an energy band diagram for the diode shown in FIG. 2; and

FIG. 5 is an enlarged view of a portion of the diode conduction band $E_c$, taken from FIG. 4.

DESCRIPTION OF AN EXEMPLARY PREFERRED EMBODIMENT

Figure 2:
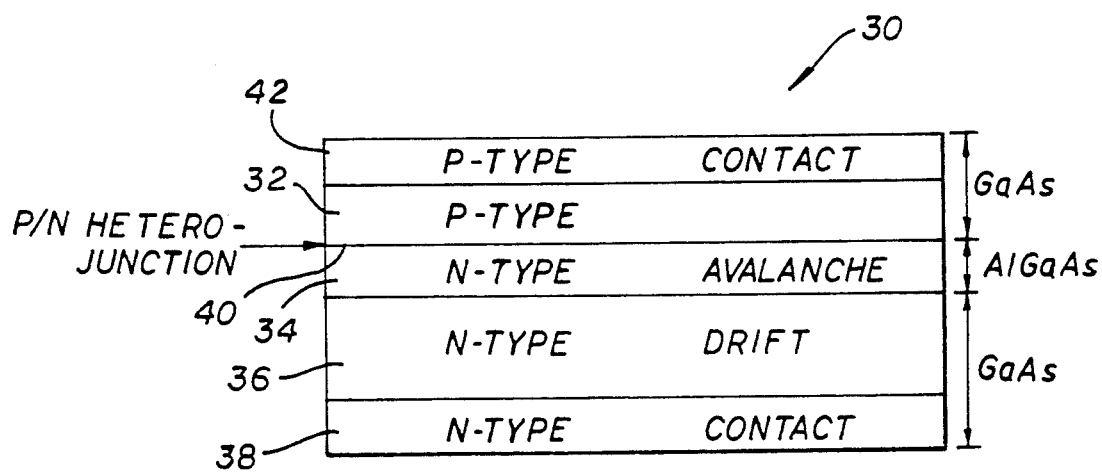
FIG. 2 is a schematic drawing of a Heterojunction IMPATT Diode constructed according to the principles of the present invention.

Referring now to FIG. 2, there is shown a heterojunction IMPATT diode 30 constructed according to the principles of the present invention. The diode 30 includes a p-type first device layer 32 of a first semiconductor material, a n-type avalanche layer 34 of a second semiconductor material, a drift layer 36 and a n-type first contact layer 38. The first device layer 32 and the avalanche layer 34 are adjacently disposed to form a pn heterojunction 40 therebetween. The drift layer 36 is adjacent the avalanche layer 34 so that the avalanche layer 34 is interposed to the first device layer 32 and the drift layer 36. The first contact layer 38 is disposed at the opposing side of the drift layer 36.

The first device layer 32 and the first contact layer 38 are adapted for application of a voltage across the diode 30. To apply more efficiently a potential to the first device layer 32, the diode 30 may further include a p-type second contact layer 42 adjacent the first device layer 32. The second contact layer 42 will then have dopant concentration greater than the dopant concentration of the first device layer 32. Similarly, the first contact layer 38 is highly doped with a dopant concentration greater than the avalanche layer 34. The dopant concentration of the drift layer may either be substantially intrinsic or slightly doped of the same conductivity of the avalanche layer 34 and first contact layer 38, or n-type as in the presently described embodiment.

The semiconductor materials selected for each of the drift layer 36, the first contact layer 38 and the second contact layer 42 may, in a broad aspect of the present invention, be a third semiconductor material, a fourth semiconductor material and a fifth semiconductor material, respectively. In the presently described embodiment of the present invention, each of the first, third, fourth and fifth semiconductor materials for the first layer 32, drift layer 36, first contact layer 38 and second contact layer 42, respectively, are identical with the above described dopant conductivity type (or polarity) and relative dopant concentrations. The second semiconductor material for the avalanche layer 34 is in the presently described embodiment an isotype of the first material. This exemplary selection of materials allows for a greater flexibility in the choice of known crystal growth and layer fabrication techniques.

The dopant concentrations for each layer are selected for the function of each particular layer. For example, the dopant concentration of the first contact layer 38 and the second contact layer 42 are over-doped to render these layers as $n^{++}$ and $p^{++}$, respectively, which allows for a high quality ohmic contact with metallization (not shown) to which the external voltages are applied. The dopant concentration for the drift layer 36 is selected to maximize the electron velocity saturation. The dopant concentrations for the first device layer 32 and avalanche layer 34 depend on the criteria of breakdown voltage and device capacitance. Specific criteria in semiconductor material selection and dopant concentrations particular to practicing the present invention are set forth in greater detail hereinbelow.

Figure 1:
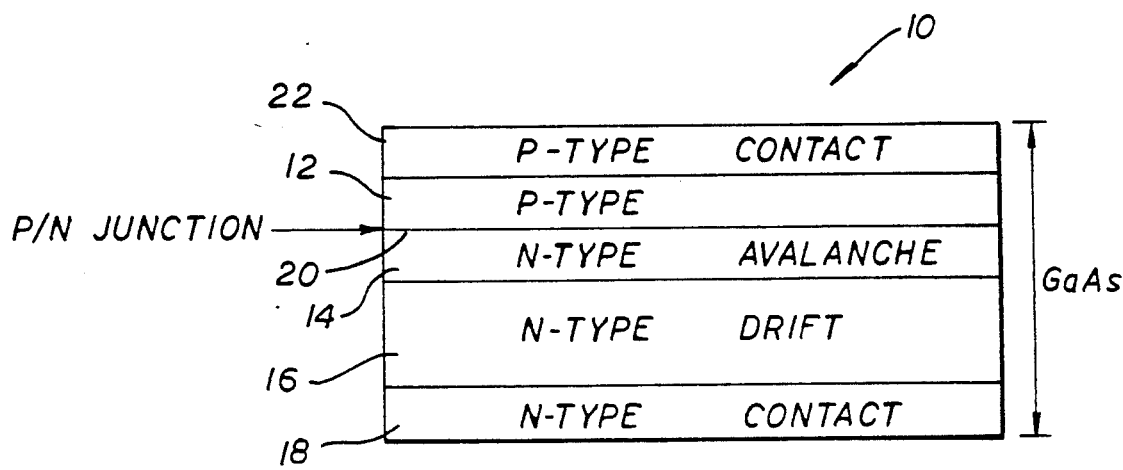
FIG. 1 is a schematic diagram of a prior art Read IMPATT Diode.

With reference to FIG. 3 (prior art) and FIG. 4, the differences between the prior art Read profile IMPATT diode 10 of FIG. 1 and the heterojunction IMPATT diode 40 of the present invention described in conjunction with FIG. 2 are compared. In each of FIG. 3 and FIG. 4, a conduction band $E_c$ and the valence band $E_v$ are shown relative to a Fermi level $E_f$ through the respective layers (indicated by the reference numerals of FIGS. 1 and 2) of the prior art diode 10 and the heterojunction diode 30 of the present invention.

In FIG. 3 (prior art), the conduction band $E_c$ and the valence band $E_v$ are the conventional prior art energy levels as would be expected from a single semiconductor material IMPATT diode. For example, the conduction band $E_c$ slightly drops at the junction between the highly doped second contact layer 22 and the lesser doped first device layer 12. The strong transition in the conduction band energy $E_c$ is shown through the pn junction 20 to the avalanche layer 14, which is highly n-type and lowers the conduction band energy $E_c$ close to the Fermi level $E_f$. The conduction energy $E_c$ band rises slightly at the drift layer 16 because of the light n-type doping and then drops at the first contact layer 18 because of the $n^{++}$-type doping. Since the bandgap energy, the difference between the valence band and the conduction band energy, remains constant through the single semiconductor material structure, the valence band energy $E_v$ has an identical profile.

In contrast to the prior art, the first semiconductor material and the second semiconductor material for the first device layer 32 and the second device layer 34 in the heterojunction IMPATT diode 30 of the present invention are selected so that the second device layer 34 has a larger bandgap energy than the first device layer 32. Furthermore, these materials are further selected so that the difference in bandgap energy occurs as a discontinuity only in a selected one of the conduction band $E_c$ or valence band $E_v$.

In the presently described exemplary embodiment of the present invention, selecting the first material to be GaAs and Aluminum Gallium Arsenide (AlGaAs) for the first device layer 32 and avalanche layer 34, respectively, allows a bandgap discontinuity 44 to occur substantially in the conduction band $E_c$ at the pn junction 40. The aluminum concentration in the isotype AlGaAs is graded to zero so that at the junction between the avalanche layer 34 and the drift layer 36 there is no discontinuity in bandgap energy. With a 30% aluminum concentration in the AlGaAs of the avalanche layer 34 at the heterojunction 40, a conduction band discontinuity of 0.30 eV will occur with an insignificant discontinuity in the valence band. With reference to FIG. 4, the valence band $E_v$ does not follow $E_c$ in the avalanche layer 34; this is the effect of grading the aluminum concentration as discussed hereinabove.

One effect of the discontinuity 44 causes the minority carriers in the first device layer 32 to become concentrated at the heterojunction 40 in absence of any externally applied bias voltage. This concentration of minority carriers increases the electric field strength within the first device layer 32 as a result of the discontinuity 44 at the junction 40. As best shown in FIG. 5, a slight drop in the conduction band $E_c$ just prior to the junction 40 indicates such a concentration. The discontinuity 44 forces the slope of the conduction band $E_c$ to be much greater near the junction 40, indicating a larger electric field, but one which is large over a short distance, typically a fraction of a micron. Therefore, the voltage drop across the second layer 34 is minimized so that primary voltage drop on the reverse biased device occurs across the drift layer 36.

It is anticipated that the present invention not be limited to a GaAs/AlGaAs heterojunction device as hereinabove described. The general criteria is to avoid picking a pair of materials where the discontinuity is shared by both the conduction band $E_c$ and the valence band $E_v$ if only a single drift layer device is being fabricated in accordance with the above described principles of the present invention. However, in a double drift layer IMPATT diode the bandgap discontinuity may be shared equally by both the conduction band $E_c$ and a valence band $E_v$. For example, a double drift layer device could be based on a Gallium Arsenide/Germanium (GaAs/Ge) heterojunction which has a conduction band discontinuity of 0.40 eV and a valence band discontinuity of 0.41 eV.

The present invention is also not limited to a $p^{++}$-p-n-n-$n^-$-$n^{++}$ device configuration as described above. A heterojunction IMPATT diode constructed as a $n^{++}$-n-p-$p^-$-$p^{++}$ device would require the bandgap discontinuity to be in the valence band $E_v$ since holes are the dominant carrier. Such a device could be a fabricated from a Gallium Arsenide/Zinc Selenium (GaAs/ZnSe) heterojunction which has a valence band discontinuity of 1.05 electron volts and a conduction band discontinuity of 0.40 electron volts.

In general, the requirements of the semiconductor material for each layer of a heterojunction IMPATT device would be sufficient bandgap discontinuity to achieve the above described effects, good lattice matching, high electron velocity saturation in the narrow bandgap material for the drift layer, and a minimum of undesired defects associated with the heterojunction itself caused by lattice mismatch. Device performance is also optimized by grading the avalanche layer material to avoid a second heterojunction between itself and the adjacent layer 36.

There has been described above an exemplary preferred embodiment of an novel heterojunction IMPATT diode. Those skilled in the art may now make numerous uses of and departures from the above described exemplary embodiment without departing from the inventive concepts disclosed herein. Accordingly, the present invention is to be defined solely by the scope of the following claims.

I claim:

1. A heterojunction IMPATT diode comprising:
   a first device layer of a first semiconductor material, said first material being of a first conductivity type and having a conjunction band and a valence band which form a first bandgap energy;
   a second device layer of a second semiconductor material, said second material being of a second conductivity type opposite said first type and having a conduction band and a valence band which form a second bandgap energy greater than said first bandgap energy, said first layer and said second layer being adjacently disposed to form a pn heterojunction therebetween, said first material and said second material being selected so that a difference between said first bandgap energy and said second bandgap energy causes a discontinuity substantially in a selected one of said conduction band and said valence band at said junction wherein said selected one contains majority carriers in said second layer;
   a third device layer of a third semiconductor material adjacent said second layer so that said second layer is interposed said first layer and said third layer; and
   a fourth device layer of a fourth semiconductor material adjacent said third layer, said fourth layer being of said second conductivity type with a greater dopant concentration than said second layer, said first layer and said third layer being adapted for application of a voltage across said diode.

2. A heterojunction IMPATT diode as set forth in claim 1 wherein said second material is graded in composition to minimize substantially a bandgap discontinuity at an interface with said third semiconductor material.

3. A heterojunction IMPATT diode as set forth in claim 1 wherein said third material is substantially intrinsic.

4. A heterojunction IMPATT diode as set forth in claim 1 wherein said third material is of said second conductivity type with a dopant concentration substantially less than a dopant concentration of said second layer.

5. A heterojunction IMPATT diode as set forth in claim 1 wherein said first material, said third material and said forth material are identical.

6. A heterojunction IMPATT diode as forth in claim 1 wherein said third material is selected to maximize electron velocity saturation.

7. A heterojunction IMPATT diode as set forth in claim 1 wherein said second material is an isotype of said first material.

8. A heterojunction IMPATT diode as set forth in claim 1 further comprising:
   a fifth device layer of a fifth semiconductor material adjacent said first device layer, said fifth layer being of said first conductivity type and having a dopant concentration greater than a dopant concentration of said first layer, said fifth layer and said fourth layer being adapted for application of said voltage.

9. A heterojunction IMPATT junction as forth in claim 8 wherein said fifth material is identical to said first material.

10. A heterojunction IMPATT diode comprising:
a first device layer of a first semiconductor material, said first material being of a first conductivity type;
a second device layer of a second semiconductor material, said second material being of a second conductivity type, said first layer and said second layer being adjacently disposed to form a pn heterojunction therebetween wherein minority carriers in said first layer become concentrated at said pn junction, said second material being selected such that said minority carriers abut said junction and form a bandgap discontinuity at said junction to enhance and concentrate the electric field within said second layer away from said pn heterojunction;
a third device layer of a third semiconductor material adjacent said second layer so that said second layer is interposed said first layer and said third layer; and
a fourth device layer of a fourth semiconductor material adjacent said third layer, said fourth material being of said second conductivity type, said first layer and said fourth layer being adapted for application of a voltage across said diode.

11. A heterojunction IMPATT diode as set forth in claim 10 wherein said second material is graded in composition to minimize substantially a bandgap discontinuity at an interface with said third semiconductor material.

12. A heterojunction IMPATT diode as set forth in claim 10 wherein said third material is substantially intrinsic.

13. A heterojunction IMPATT diode as set forth in claim 10 wherein said third material is of said second conductivity type with a dopant concentration substantially less than the a dopant concentration of said second layer.

14. A heterojunction IMPATT diode as set forth in claim 10 wherein said first material, said third material and said forth material are identical.

15. A heterojunction IMPATT diode as forth in claim 10 wherein said third material is selected to maximize electron velocity saturation.

16. A heterojunction IMPATT diode is set forth in claim 10 wherein said second material is a isotype of said first material.

17. A heterojunction IMPATT diode as set forth in claim 10 further comprising:
a fifth device layer of a fifth semiconductor material adjacent said first device layer, said first conductivity type and having a dopant concentration greater than a dopant concentration of said first layer, said fifth layer and said fourth layer being adapted for application for said voltage.

18. A heterojunction IMPATT junction as forth in claim 17 wherein said fifth material is identical to said first material.

19. A heterojunction IMPATT diode comprising:
a p-type Gallium Arsenide first device layer;
a n-type Aluminum Gallium Arsenide avalanche layer adjacent said first device layer to form a pn heterojunction therebetween, said avalanche layer having a higher conduction band energy at said junction then a conduction band energy of said first layer such that a conduction band discontinuity exists at said junction;
a Gallium Arsenide drift layer adjacent said avalanche layer so that said avalanche layer is interposed said first layer and said drift layer; and
a n-type Gallium Arsenide first contact layer adjacent said drift layer, said first device layer and said first contact layer being adapted for application of a voltage across said diode.

20. A heterojunction IMPATT diode as set forth in claim 19 wherein a concentration of aluminum in said avalanche layer is graded to minimize substantially a bandgap discontinuity at an interface with said drift layer.

21. A heterojunction IMPATT diode as set forth in claim 19 wherein said drift layer is a low doped n-type layer.

22. A heterojunction IMPATT diode as set forth in claim 20 wherein said concentration is 30% at said junction.

23. A heterojunction IMPATT diode as set forth in claim 19 further comprising:
a p-type Gallium Arsenide second contact layer adjacent said first device layer, said second contact layer having a dopant concentration greater than a dopant concentration of said first device layer, said first contact having a dopant concentration greater than a dopant concentration of said avalanche layer.

* * * * *